(12) United States Patent
Liu

(10) Patent No.: US 11,880,641 B2
(45) Date of Patent: Jan. 23, 2024

(54) PIXEL DESIGN METHOD, PIXEL DESIGN DEVICE, AND ELECTRONIC EQUIPMENT

(71) Applicant: Shenzhen China Star Optoelectronics Semiconductor Display Technology Co., Ltd., Guangdong (CN)

(72) Inventor: Yang Liu, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 777 days.

(21) Appl. No.: 16/968,388

(22) PCT Filed: Jul. 14, 2020

(86) PCT No.: PCT/CN2020/101839
§ 371 (c)(1),
(2) Date: Aug. 7, 2020

(87) PCT Pub. No.: WO2021/253548
PCT Pub. Date: Dec. 23, 2021

(65) Prior Publication Data
US 2023/0153498 A1    May 18, 2023

(30) Foreign Application Priority Data

Jun. 15, 2020   (CN) .......................... 202010541676.7

(51) Int. Cl.
*G06F 30/31* (2020.01)
*G06F 30/392* (2020.01)
*G09G 3/36* (2006.01)

(52) U.S. Cl.
CPC ............ *G06F 30/31* (2020.01); *G06F 30/392* (2020.01); *G09G 3/3607* (2013.01)

(58) Field of Classification Search
CPC .................................................... G06F 30/31
USPC ....................................................... 716/119
See application file for complete search history.

(56) References Cited

U.S. PATENT DOCUMENTS

| 2004/0164935 A1* | 8/2004 | Dedene ................ H10K 59/353 345/75.2 |
| 2009/0225249 A1 | 9/2009 | Wang et al. |
| 2011/0230009 A1 | 9/2011 | Lin et al. |

FOREIGN PATENT DOCUMENTS

| CN | 1471070 A | 1/2004 |
| CN | 101526707 A | 9/2009 |
| CN | 101566766 A | 10/2009 |
| CN | 105812881 A | 7/2016 |

(Continued)

OTHER PUBLICATIONS

Sun, Shixiang Mar. 31, 2013 Liquid Crystal Display Technology pp. 73-90.

*Primary Examiner* — Eric D Lee
(74) *Attorney, Agent, or Firm* — PV IP PC; Wei Te Chung; Zhigang Ma

(57) ABSTRACT

A pixel design method, a pixel design device, and equipment are provided. The method includes obtaining design dimension and resolution information of a display panel configured by a user; computing dimensions of a single pixel of the display panel based on the design dimension information of the display panel and design resolution information of the display panel; and drawing a pixel design diagram of the single pixel in the display panel based on the dimensions of the single pixel and the pixel design strategy information.

20 Claims, 8 Drawing Sheets

(56) References Cited

FOREIGN PATENT DOCUMENTS

| | | |
|---|---|---|
| CN | 106444136 A | 2/2017 |
| CN | 110865785 A | 3/2020 |
| JP | 2004272244 A | 9/2004 |
| JP | 2008224931 A | 9/2008 |

* cited by examiner

| | | new product | 27 FHD (benchmarking) |
|---|---|---|---|
| PEP | Film (material) | Film THK(Å) | Film THK(Å) |
| GE | Al | 5000 | 5000 |
| AS | G-SiNx | 4000 | 4000 |
| | a-Si+N+ | 2000 | 2000 |
| SE | Al | 5000 | 5000 |
| Via | PV1 | 2000 | 2000 |
| | PV2 | 3000 | 3000 |
| PE | ITO | 1000 | 1000 |
| Cell gap (um) /same LCD | | 3.0 | 3.0 |
| Tr% | | ? | 5% |

FIG. 12

PIXEL DESIGN METHOD, PIXEL DESIGN DEVICE, AND ELECTRONIC EQUIPMENT

FIELD OF INVENTION

The present disclosure relates to the field of display technology, and specifically relates to a pixel design method, a pixel design device, and an electronic equipment.

BACKGROUND OF INVENTION

With development of display technology, because flat-panel display devices liquid crystal displays (LCDs) and organic light emitting diodes (OLEDs) have advantages of high picture quality, power savings, thin bodies and wide application range, they are widely used in mobile phones, televisions, personal digital assistants, laptops, desktop computers, and other similar consumer electronics, and have become mainstream display devices.

Generally, in a display panel pixel designing process, comparative analyses are mainly performed between existing product bases. In-company products with same dimensions, resolution rates, or pixel dimensions are used as a reference against new products with the same specifications on the market, and the two are combined to define various standard values of new products. Designs that satisfy new product standards are finally obtained by manually designing pixel drawings, running optical and electric simulations, etc., repeatedly comparing to pixel designs of mass production products, and checking related specifications of the pixel designs.

Most pixel designs in the prior art are stuck in repetitive iterations of manual design and check, in which design tools are used to manually draw designs step-by-step, which is extremely time intensive and requires multiple checks, while there also exists a risk of missing checks. Because specifications for various designs are extensive and there is a heavy reliance on design experience, rookies easily make mistakes. Furthermore, various design parameters need to be calculated manually, with a great number of iterations needed for pixel designs, resulting in the design process being complicated and time-inefficient, and is not conducive in getting products onto the market.

SUMMARY OF INVENTION

Embodiments of the present disclosure provide a pixel design method, a pixel design device, and an electronic equipment, which is able to intelligently perform drawing of pixel designs, is able to lower dependency on design experiences from designers, and does not need the designers to calculate design parameters manually during a user performing pixel design processes. Therefore, duration and assessment time of product designs are reduced, pixel designs of products that satisfies requirements are produced rapidly, research and development efficiency is improved, and human resources and cost are saved.

In order to solve the problems mentioned above, the present disclosure provides a pixel design method, and the method includes:

obtaining design dimension and resolution information of a display panel configured by a user;

computing dimensions of a single pixel of the display panel based on the design dimension and resolution information of the display panel;

obtaining a preset pixel design strategy information, wherein the pixel design strategy information comprises design transmittance rate information of the display panel; and drawing a pixel design diagram of the single pixel in the display panel based on the dimension of the single pixel and the pixel design strategy information.

On another aspect, the present disclosure provides a pixel design device, and the device includes:

a first obtaining module used for obtaining design dimension and resolution information of a display panel configured by a user;

a computing module used for computing a dimension of a single pixel of the display panel based on the design dimension and resolution information of the display panel;

a second obtaining module used for obtaining a preset pixel design strategy information, wherein the pixel design strategy information includes design transmittance rate information of the display panel; and a drawing module used for drawing a pixel design diagram of the single pixel in the display panel based on the dimension of the single pixel and the pixel design strategy information.

On another aspect, the present disclosure provides an electronic equipment, and the electronic equipment includes: one or a plurality of processors;

a storage device; and one or a plurality of application programs, wherein the one or the plurality of application programs is/are stored in the storage device and is/are executed by the processors to realize the pixel design method.

In a pixel design stage of the display panel, the present disclosure can compute a dimension of a single pixel based on design dimension and resolution information configured by the user, and can draw a pixel design diagram of the single pixel in the display panel based on the dimension of the single pixel and the pixel design strategy information. During pixel design processes performed by the user, and on the basis of the design dimension information of the display panel, embodiments of the present disclosure are able to intelligently perform drawing of pixel designs of the single pixel, are able to lower dependency on design experiences from designers, and do not need the designers to calculate design parameters manually, design resolution information of the display panel, and preset pixel strategy information. Therefore, duration and assessment time of product designs are reduced, pixel designs of products that satisfies requirements are produced rapidly, research and development efficiency is improved, and human resources and cost are saved.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

FIG. 12 is a schematic diagram of comparison between parameters of a structural section of a new product and a benchmarking product of an embodiment of the present disclosure.

DETAILED DESCRIPTION OF PREFERRED EMBODIMENTS

Figure 1:
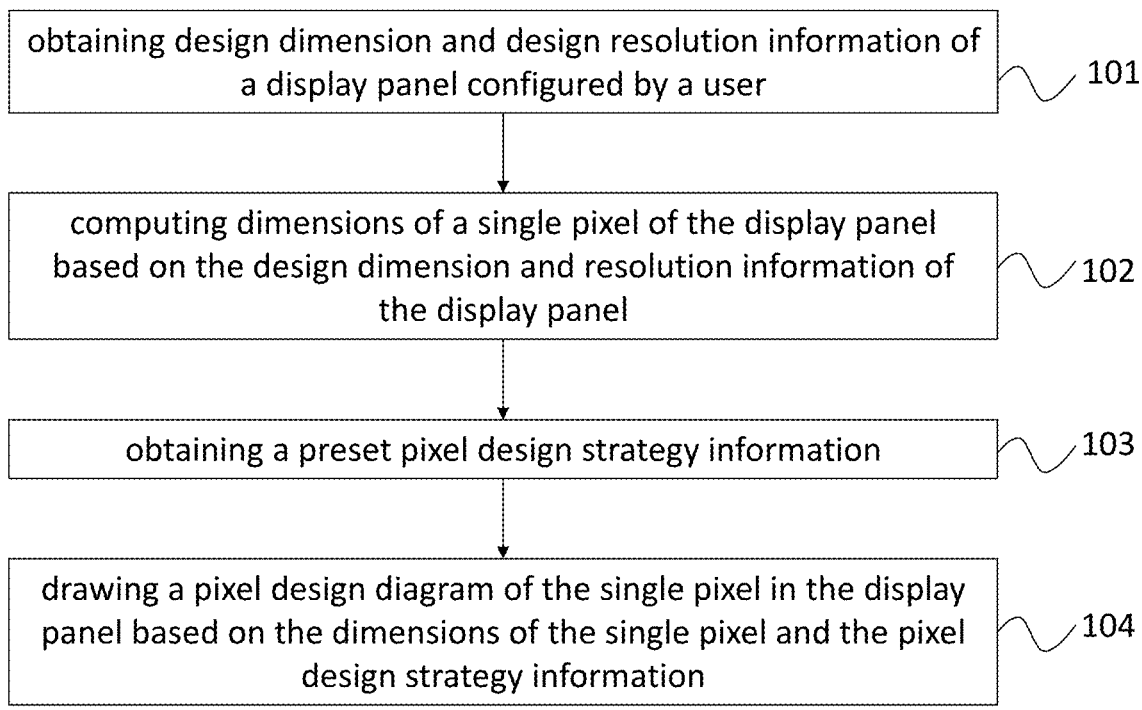
FIG. 1 is a flowchart of an embodiment of a pixel design method provided by an embodiment of the present disclosure.

The technical solutions in the embodiments of the present disclosure are clearly and completely described in the following with reference to the accompanying drawings in the embodiments of the present disclosure. Obviously, the described embodiments are only part of the embodiments of the present disclosure, and are not all embodiments of the present disclosure. All other embodiments obtained by those skilled in the art based on the embodiments of the present disclosure without creative efforts are within the scope of the present disclosure.

In the description of the present disclosure, it is to be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", etc. is based on the orientation or positional relationship shown in the accompanying figures, which is merely for the convenience for describing of the present disclosure and for the simplification of the description, and is not intended to indicate or imply that the indicated devices or elements have a specific orientation or is constructed and operated in a specific orientation. Therefore, it should not be understood as a limitation on the present disclosure. Moreover, the terms "first" and "second" are used for descriptive purposes only and are not to be understood as indicating or implying relative importance or implicitly indicating the number of the indicated technical characteristics. Therefore, the characteristics defined by "first" or "second" may include one or more of the described characteristics either explicitly or implicitly. In the description of the present disclosure, the meaning of "a plurality" is two or more unless clearly and specifically defined otherwise.

In the present disclosure, the term "exemplary" is used to mean "serving as an example, instance, or illustration." Any embodiment described in this application as "exemplary" is not necessarily to be interpreted as preferred or advantageous over other embodiments. The following description is presented for enable any person skilled in the art to make and use the present disclosure. In the following description, details are listed for the purpose of explanation. It should be understood that one skilled in the art will recognize that the present disclosure can be practiced without the specific details. In other embodiments, well-known structures and procedures are not described in detail to avoid unnecessary details making the description of the present disclosure to become opacity. Therefore, the present disclosure is not intended to be limited to the embodiments shown, but is in accordance with the broad scope of the principles and characteristics disclosed by present disclosure.

Embodiments of the present disclosure provide a pixel design method, a pixel design device, and an electronic equipment. The details are described below respectively.

Firstly, a pixel design method of an embodiment of the present disclosure is described. The pixel design method is executed in electronic equipment. The electronic equipment can be a desktop terminal or a mobile terminal. Specifically, the electronic equipment can further be one of a mobile phone, a tablet PC, a laptop, etc.

Illustrated in FIG. 1 is a flowchart of the embodiment of the pixel design method of the embodiment of the present disclosure, and the method includes:

101: obtaining design dimension and design resolution information of a display panel configured by a user.

In this embodiment, when a designer (user) needs to perform a pixel design on a single pixel, the design dimension information of the display panel required to be designed and the design resolution information of the display panel can be configured in advance. Specifically, the user can input their own configuration here. For example, upon entering a corresponding program of the pixel design method, the user can click a preset design menu or an input interface, and the design dimension and resolution information of the display panel will pop up automatically. After the user enters related parameters, the design dimension information of the display panel and the design resolution information of the display panel configured by the user are obtained.

For example, the design dimension of the display panel corresponding to a current pixel design is 55' ultra high definition (UHD), a diagonal of an effective display region is 138731.517152 μm, and a design resolution rate of the display panel is 2160*3840.

102: computing dimensions of a single pixel of the display panel based on the design dimension and resolution information of the display panel.

Because the design dimension of the display panel is generally a length of the diagonal of the display panel, at this time, the design dimension information of the display panel includes a length of the diagonal of the effective display region. For example, the length of the diagonal of the effective display region of the 55' UHD is 138731.517152 μm.

In the step 102, the step of computing the dimensions of the single pixel of the display panel based on the design dimension and resolution information of the display panel can include: obtaining an aspect ratio of the display panel according to the Pythagorean theorem by computing a length and a width of the effective display region in the display panel according to the aspect ratio of the display panel and the diagonal length of an effective display region in the display panel, and computing the dimensions of the single pixel in the display panel respectively according to the length and the width of the effective display region in the display panel and the design resolution information of the display panel.

Furthermore, an aspect ratio (style) is generally constant, for example, 16:9, and there are also individual design changes, for example: 21:9, thus it is also possible to obtain custom aspect ratios input by the user.

The following are combined with a specific embodiment to describe how to calculate the dimensions of the single pixel of the display panel based on the design dimension and resolution information of the display panel.

The design dimension of the display panel: Size(diagonal length, unit: inch); the aspect ratio of the display panel: Style; the design resolution rate of the display panel: Reso (Resolution); the dimensions of the single pixel: pixel length (A), pixel width (B).

By the following formula, a length and a width of the effective display region can be obtained:

$$Length^2 + Width^2 = Size^2$$

$$Width = (Size^2/(1+Style^2))^{1/2}$$

$$Length = Width * Style$$

The dimensions of the single pixel can be obtained from the length and the width of the effective display region respectively divided by the resolution rate. For example, the 55' UHD, which diagonal length is 138731.517152 μm, and aspect ratio is 16:9, the length and the width of the effective display region are calculated as 1209600 μm and 680400 um according to the Pythagorean theorem, and the resolution rate is 2160*3840. At this time, a calculation manner of the dimensions of the single pixel as the following can be:

$$\text{pixel length }(A) = 680400/2160 = 315 \text{ μm}$$

$$\text{pixel width }(B) = 1209600/3840/3(RGB) = 105 \text{ μm}$$

103: obtaining a preset pixel design strategy information.

Generally, it is difficult to have an objective definition for the standards of the display panel, because consumer opinion regarding products are often subjective. There are different standards of display panels provided by different manufacturers. However, it is necessary for designers to transform requirements from the consumers and the manufacturers into quantized data for design targets, that is, it needs to transform these requirement standards into a standard able to be designed, that is, a design standard (professional standard). The preset pixel design strategy information of the display panel of the embodiment of the present disclosure are pixel design specifications or pixel design standards of the display panel configured in advance, so as to draw the pixel design diagram according the pixel design strategy information based on the pixel data of the display panel configured by the user when designing.

104: drawing a pixel design diagram of the single pixel in the display panel based on the dimensions of the single pixel and the pixel design strategy information.

Specifically, drawing the pixel design diagram of the single pixel in the display panel based on the dimensions of the single pixel and the pixel design strategy information can be: drawing the pixel design diagram of the single pixel in the display panel based on the dimensions of the single pixel and the pixel design strategy in a preset drawing space, wherein the preset drawing space can be a design program corresponding to the pixel design method or an initial design space of design plugins, for example, a design space of electronic design automation (EDA) described in the following embodiment during performing pixel intelligent design.

It should be noted, because the embodiment of the present disclosure is executed in the electronic equipment, each executed object exists in a form of data or information, for example, the pixel design strategy is actually pixel design strategy information (such as subsequent various pixel strategy information existing in a form of tables). Moreover, for example, the dimensions of the single pixel of the display panel is actually a dimension information of the single pixel of the display panel. It should be noted that line widths, dimensions, numbers, positions, etc. mentioned in following embodiments exist in corresponding data, being conducive to processing by the electronic equipment, and redundant description will not be mentioned herein.

In a pixel design stage of the display panel, an embodiment of the present disclosure can compute dimensions of a single pixel based on design dimension and resolution information configured by the user, and can draw a pixel design diagram of the single pixel in the display panel based on the dimensions of the single pixel and the pixel design strategy information. During pixel design processes performed by the user, the embodiment of the present disclosure can intelligently drawing diagrams that can be performed on pixel designs on the basis of the design dimension information of the display panel, dependency on design experiences from designers can be lowered, and the designers calculating design parameters manually does not need. Therefore, duration and assessment time of product designs are reduced, pixel designs of products that satisfy requirements are produced rapidly, research and development efficiency is improved, and human resources and costs are saved.

In an embodiment of the present disclosure, an execution program of the pixel design method can be loaded as a form of plugins in a design program of the display panel, and also can be an intelligent pixel design program independent from a display panel design program, as long as the display panel design parameters corresponding to the user's current design operation can be collected in the display panel design program, and specifically is not limited herein.

Furthermore, the display panel design program can be current electronic design automation (EDA) programs for display panel designs, such as Protel, Altium Designer, PSPICE, OrCAD, etc.

The pixel design strategy information includes design transmittance rate information of the display panel. The transmittance rate can be inputted and configured by the user. Because influencing factors of transmittance rates for new products are many and complicated, specifically, the transmittance rate can be determined in advance based on same-type products by the user. For example, a transmittance rate of a display panel with same dimensions can be used to act as a transmittance rate of a current display panel.

After the design transmittance rate of the display panel is determined, a design aperture ratio of the pixel design of the current display panel can be determined. For example, if the transmittance rate is determined, and then a product B is used as comparison. Selections of materials and films are the same, so an aperture ratio of the product A is computed according to: (the transmittance rate of A)*(an aperture ratio of B)=(the aperture ratio of A)*(the transmittance rate of B), wherein a product A is the current display panel. After the design aperture ratio of the pixel design of the display panel is determined, it can be used for drawing the pixel design diagram of the single pixel in the display panel.

It should be noted that the display panel in an embodiment of the present disclosure can be various display panels, for example, a liquid crystal display (LCD), an organic light emitting diode (OLED) display panel, and specifically, such as a thin film transistor liquid crystal display (TFT-LCD) panel, etc.

Figure 2:
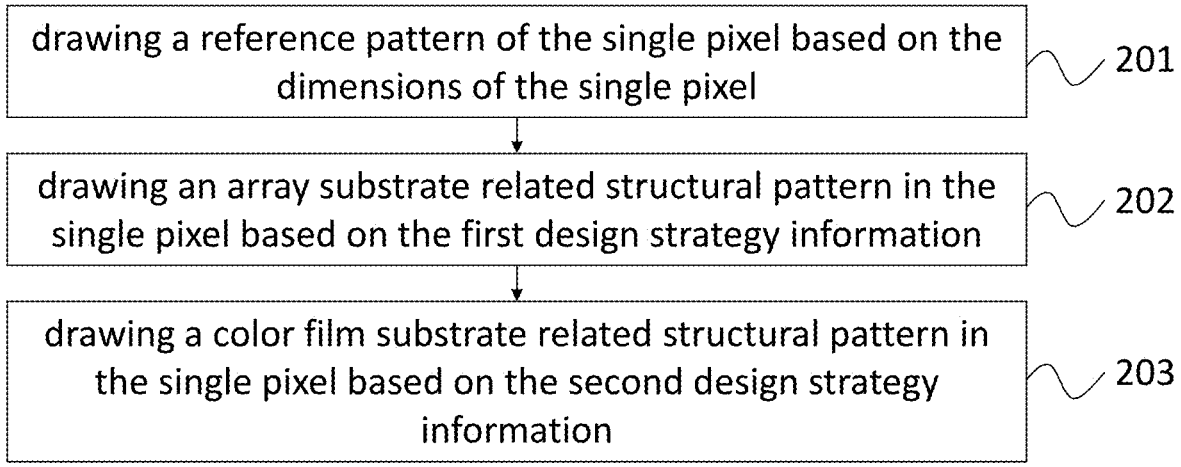
FIG. 2 is a flowchart of an embodiment of a step 104 provided by an embodiment of the present disclosure.

In some embodiments of the present disclosure, when the display panel is the LCD display panel, because the LCD display panel includes basic structures such as an array substrate, a liquid crystal cell, a top polarizer, a color film substrate, a bottom polarizer, etc., the pixel design strategy information can include a first design strategy information of a pixel related structure in an array substrate, and a second design strategy information of a pixel related structure in a color film substrate. At this time, as illustrated in FIG. 2, the step 104 of drawing the pixel design diagram of the single pixel in the display panel based on the dimensions of the single pixel and the pixel design strategy information can include steps 201 to 203, the specific is as follows:

201: drawing a reference pattern of the single pixel based on the dimensions of the single pixel.

Figure 3:
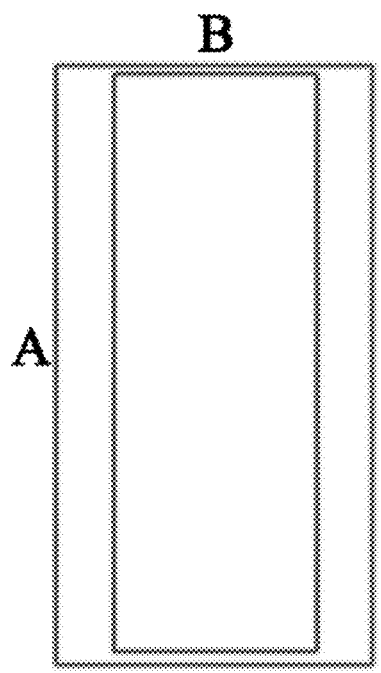
FIG. 3 is a structural schematic diagram of a reference pattern of a dimension of a single pixel of an embodiment of the present disclosure.

After the dimensions of the single pixel is determined, the dimensions of the single pixel can be used to draw the reference pattern of the single pixel, and each of subsequent layers of the pixel design can be based on the reference pattern. As illustrated in FIG. 3, taking the dimensions of the single pixel, which are pixel length (A) and pixel width (B), to draw the reference pattern.

202: drawing an array substrate related structural pattern in the single pixel based on the first design strategy information; and 203: drawing a color film substrate related structural pattern in the single pixel based on the second design strategy information.

In this embodiment, after the reference pattern of the single pixel is drawn, the array substrate related structural pattern in the single pixel and the color film substrate related structural pattern in the single pixel can be respectively drawn.

Figure 4:
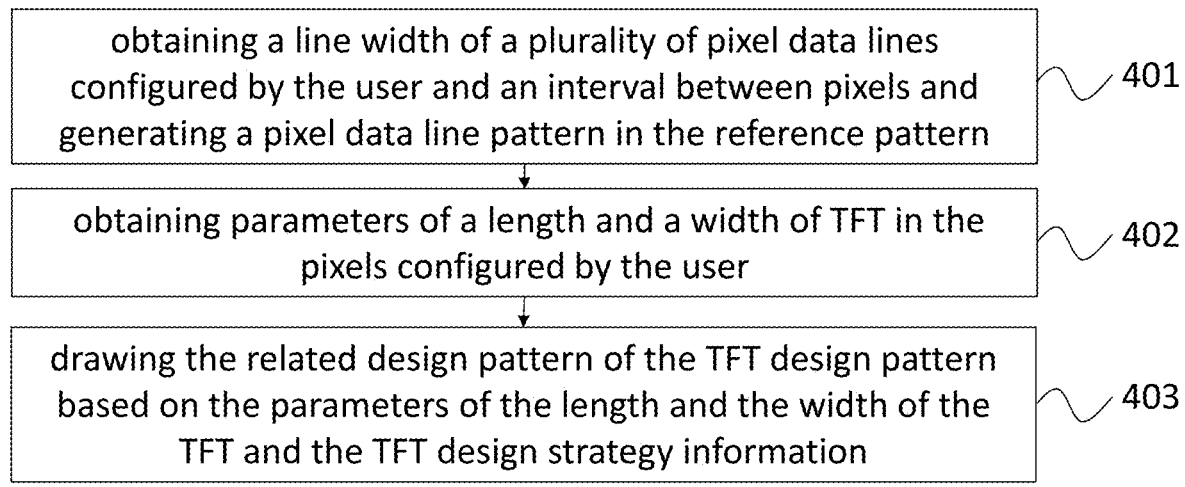
FIG. 4 is a flowchart of an embodiment of a step 202 provided by an embodiment of the present disclosure.

In this embodiment, the array substrate can be a TFT array substrate. The first design strategy information includes a TFT design strategy information of the display panel. The array substrate related structural pattern includes a related design pattern of a TFT design pattern. At this time, as illustrated in FIG. 4, the step 202 of drawing the array substrate related structural pattern in the single pixel based on the first design strategy information can further include steps 401 to 403, and the specific are is as follows:

401: obtaining a line width of a plurality of pixel data lines configured by the user and an interval between pixels and generating a pixel data line pattern in the reference pattern.

Figure 5:
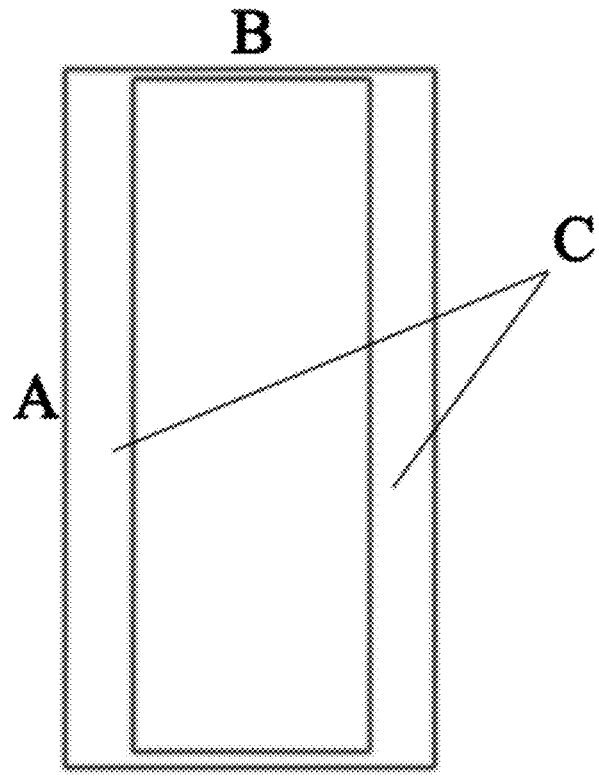
FIG. 5 is a structural schematic diagram of a pixel data line pattern of an embodiment of the present disclosure.

In this embodiment, the line width of a plurality of pixel data lines and the interval between pixels configured by the user can be obtained. As illustrated in FIG. 5, a pixel data line pattern can be generated in the reference pattern based on the line width of a plurality of pixel data lines and the interval between pixels, wherein C is the drawn data line pattern.

402: obtaining parameters of a length and a width of TFT in the pixels configured by the user.

In this step, the parameters of the length and the width of TFT in the pixels configured by the user can be obtained, that is, an L value and a W value of the TFT.

403: drawing the related design pattern of the TFT design pattern based on the parameters of the length and the width of the TFT and the TFT design strategy information.

Specifically, the step 403 of drawing the related design pattern of the TFT pattern based on the parameters of the length and the width of the TFT and the TFT design strategy information can further include steps (1) to (4) as follows:

(1): drawing the TFT pattern in each of pixels of the display panel based on the parameters of the length and the width of the TFT and the TFT design strategy information.

Figure 6:
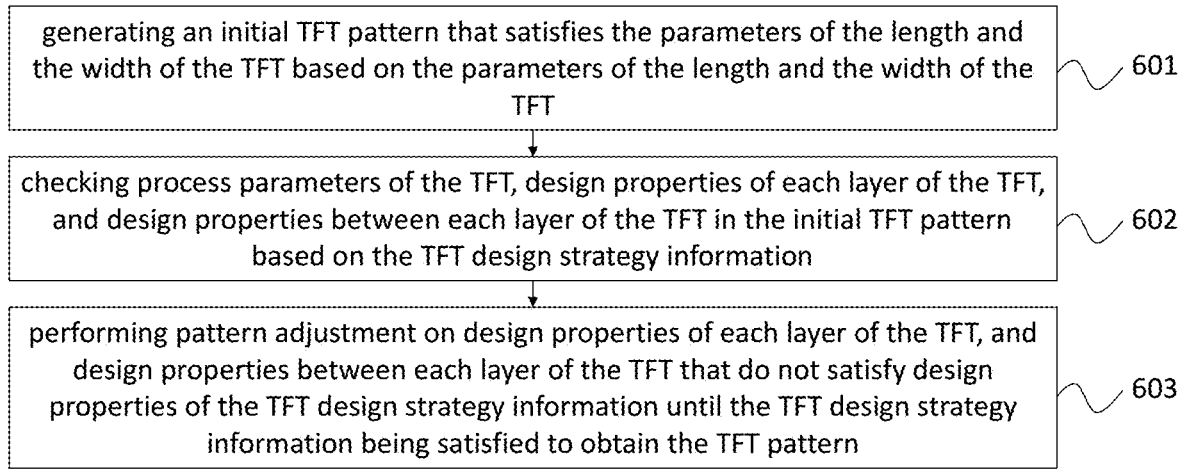
FIG. 6 is a flowchart of an embodiment of drawing thin film transistor (TFT) patterns in each pixels of the display panel of the embodiment of the present disclosure.

Furthermore, the parameters of the length and the width of the TFT are parameters of a channel length and a channel width of the TFT. As illustrated in FIG. 6, the step of drawing the TFT pattern in each of the pixels of the display panel based on the parameters of the length and the width of the TFT and the TFT design strategy information can further include steps 601 to 603:

601: generating an initial TFT pattern that satisfies the parameters of the length and the width of the TFT based on the parameters of the length and the width of the TFT.

The step of generating an initial TFT pattern that satisfies the parameters of the length and the width of the TFT based on the parameters of the length and the width of the TFT can be invoking a TFT pattern in a preset TFT pattern base based on the parameters of the length and the width of the TFT to generate an initial TFT pattern that satisfies the parameters of the length and the width of the TFT. That is, because the shapes of the TFT patterns are basically similar, and the main difference is the parameters of the length and the width between the TFTs, a TFT pattern in the preset TFT pattern base can be directly invoked to generate the initial TFT pattern that satisfies the parameters of the length and the width of the TFT based on the determined parameters of the length and the width of the TFT.

602: checking process parameters of the TFT, design properties of each layer of the TFT, and design properties between each layer of the TFT in the initial TFT pattern based on the TFT design strategy information.

Furthermore, the TFT design strategy information includes a process parameter strategy information of the TFT, a design property strategy information of each layer of the TFT, and design property strategy information between each layer of the TFT.

The process parameter strategy information of the TFT includes at least one of an electron mobility requirement, a cut-off current requirement, a leakage current requirement, a parasitic capacitance requirement, or a TFT fillet design requirement. The design property strategy information of each layer of the TFT include at least one of a material and thickness strategy information, definition strategy information of line width limitation of each of the layers. The design property strategy information between each layer of the TFT includes interval strategy information between each of the layers of the TFT, alignment error limitation strategy information between each layer of the TFT, etc.

At this time, process parameters of the TFT include at least one of an electron mobility parameter, a cut-off current parameter, a leakage current parameter, a parasitic capacitance parameter, or a TFT fillet design parameter. The design properties of each layer of the TFT include at least one of material and thickness parameters, line width parameters of each of the layers. The design properties between each layer of the TFT include interval parameters between each of the layers of the TFT and alignment error limitation parameters between each layer of the TFT.

The following takes an TFT-LCD display panel as an example to describe the design strategy information of the display panel.

Regarding to TFT-LCD display panels, extensive knowledge of the professional field is included. Therefore, professional standards are related. These professional standards are not isolated from each other, so during design of the display panels, all standards are not just a simple combination, so while they should be coordinated with each other, the design target and position of the design should be clear to ensure the final product succeeds.

For the TFT-LCD display panels, the TFT design strategy information can include material and thickness strategy information, an alignment error limitation strategy information, and process parameter strategy information of the TFT.

In a specific embodiment, the material and the thickness strategy information can include material and thickness information of at least one of a gate electrode, a gate insulating layer, a semiconductor layer, a doping semiconductor layer, a source/drain electrode metal, or a transparent electrode. The material and thickness strategy information can specifically include contents of the following table 1. It can be understood that the material and thickness strategy information in FIG. 1 are only as an example, and the material and thickness strategy information of the FIG. 1 can include more or less of the material and the thickness strategy information in an actual application, and they are not limited herein.

TABLE 1

Material and thickness

| gate electrode, common electrode metal | molybdenum tungsten (MoW), impedance value: 14 μQ · cm, 200 nm | also acted as scanning lines and common electrode lines |
|---|---|---|
| gate insulating layer | SiNx, ζ = 6.9, t = 360 nm | |
| semiconductor layer | a-St, μ = 0.3 cm² /(V · s), t = 100 nm | |
| doping semiconductor layer | heavy doping N-type a-Si, t = 50 nm | |
| source/drain electrode metal | Al-Nd, ρ = 4 μQ · cm, t = 600 nm | also acted as data lines |
| protective insulating layer | SiNx, ζ = 6.0, t = 400 nm | |
| transparent electrode | ITO, ρ = 30 μQ · cm, t = 800 nm | | thickness error < 10%

In a specific embodiment, the line width limitation strategy information includes at least one of line width limitation information of gate electrode metal lines, semiconductor layer lines, source/drain electrode metal lines, contact holes, or indium tin oxide (ITO) transparent electrodes. Specifically, the line width limitation strategy information can include contents of following table 2 specifically. It can be understood that the line width limitation strategy information in the table 2 is only an example, and in an actual application, it can include more or less line width limitation information, and it is not limited herein.

TABLE 2

| line width limitation | |
|---|---|
| gate electrode metal line | minimum width: 5 μm<br>minimum interval: 3.5 μm<br>difference between mask dimension and actual dimension: (1 ± 0.5) μm |
| semiconductor layer line | minimum width: 5 μm<br>minimum interval: 4 μm<br>difference between mask dimension and actual dimension: (1 ± 0.5) μm |
| source/drain electrode metal | minimum line width: 7 μm<br>minimum interval: 4 μm<br>difference between mask dimension and actual dimension: (2 ± 1) μm |
| contact hole | minimum width: 3 μm<br>minimum interval: 3 μm<br>difference between mask dimension and actual dimension: (−1 ± 1) μm |
| ITO transparent electrode | minimum interval: 3.5 μm<br>difference between mask dimension and actual dimension: (1 ± 1) μm |

In a specific embodiment, the alignment error limitation strategy information includes at least one of alignment error limitation information of the semiconductor layer and the gate electrode metal, the source/drain electrode metal and the gate electrode metal, the source/drain electrode metal and the semiconductor layer, the contact holes and the gate electrode, the contact holes and the source/drain electrode metal, the transparent electrode and the source/drain electrode metal, the transparent electrode and the gate electrode metal, or the transparent electrode and the contact holes. Specifically, the alignment error limitation strategy information can include contents of following table 3 specifically. It can be understood that the alignment error limitation strategy information in the table 3 is only an example, and in an actual application, it can include more or less alignment error limitation strategy information, and it is not limited herein.

TABLE 3

| alignment error limitation | |
|---|---|
| semiconductor layer VS. gate electrode metal | the minimum length of the gate electrode extending out from the semiconductor: 3 μm<br>alignment error: 0.6 μm |
| source/drain electrode metal VS. gate electrode metal | |
| source/drain electrode metal VS. semiconductor layer | the minimum overlapping width: 3 μm<br>alignment error: 1 μm |
| contact holes VS. gate electrode | the minimum length of the gate electrode extending out from the contact holes: 4 μm alignment error: 0.6 μm |
| contact holes VS. source/drain electrode metal | the minimum length of the source/drain electrode extending out from the contact holes: 5 μm alignment error: 1 μm |
| transparent electrode VS. gate electrode metal | alignment error: 0.6 μm |
| transparent electrode VS. source/drain electrode metal | alignment error: 1 μm |
| transparent electrode VS. the contact holes | the minimum length of the ITO extending out from the contact holes: 5 μm alignment error: 1 μm |

In a specific embodiment, the process parameter strategy information of the TFT includes at least one of process parameters of electron mobility, a cut-off voltage, a leakage current, or a parasitic capacitance. Specifically, the process parameter strategy information of the TFT can include contents of following FIG. 4. It can be understood that the process parameter strategy information of the TFT in FIG. 4 is only an example, and the process parameter strategy information of the TFT of the FIG. 4 can include more or less of the process parameter strategy information of the TFT in an actual application, and they are not limited herein.

TABLE 4

| the process parameter of the TFT | | |
|---|---|---|
| electron mobility | a normal value: 0.15 cm$^2$/(V.s) | |
| cut-off voltage | a maximum value: 1 V a minimum value: −0.5 V | |
| leakage current | less than 0.1 pA/μm | total leakage current divided by a width of a channel |
| parasitic capacitance | a normal value: 0.17 fF/μm | total capacitance divided by the width of the channel |

Generally, in order to make the designed display panel be able to satisfy requirements of a driving principle in various situations, a used design concept is "a design in the worst situation", that is, it is considered to be used in the worst situation during design. Therefore, it will be no problem in other situations. For example, a frame frequency of images ranges from 60 Hz to 75 Hz, and then 75 Hz is considered as a charging time in, while 60 Hz is considered as a holding time in. As such, if it can satisfy the two critical conditions, and of course, it can also satisfy conditions in other frequencies. Therefore, similar principles are used in embodiments of the present disclosure. Only singular numerical values are listed in the tables 1 to 4 mentioned above, and these indicate a value in the singular numerical values is a design value in the worst situation, so a design value comparing to the design value in a better trend satisfies design requirements. Taking the electron mobility of the TFT in FIG. 4 as an example, the normal value is the design value in the worst situation. In a general situation, the higher electron mobility of the TFT can indirectly help the resolution rate of the display improve. Therefore, the electron mobility greater than the normal value can satisfy the design specification.

It should be noted that the TFT design strategy information in FIG. 1 to FIG. 4 are examples of only part of the strategy information. It can be understood that except the TFT design strategy information of the examples mentioned above, in the embodiments of the present disclosure, more other TFT design strategy information such as a number of terminals, etc. can be included according to actual requirements. Redundant description in the embodiments of the present disclosure will not be mentioned herein. Any design strategy information based on the design specification can be used on the basis of invention idea of the present disclosure, and it is not limited herein specifically.

In addition, different design strategy information of the display panel can be configured for different display panels in actual using processes. In order to achieve the best for a certain characteristic, more design parameters can be configured in design strategy information of related display panel. For example, in table 4, the electron mobility of the TFT is a normal value, and configuring it to be a larger electron mobility value can indirectly improve the resolution rate of the display and can satisfy design requirements of a higher resolution rate of the display.

In the pixel design, two design values close to the all design relations mostly are respectively an amount of the storage capacitor and the channel width W of the TFT, while other designs are not unimportant, but they are not changed easily. Taking a channel length of the TFT as an example, it is generally set at a minimum limitation of manufacturing ability to obtain the largest breaking current and the minimum load capacitance, and the materials and the thickness of the gate insulating layer, or metal conductive layer, etc. are similar to it.

603: performing pattern adjustment on design properties of each layer of the TFT, and design properties between each layer of the TFT that do not satisfy design properties of the TFT design strategy information until the TFT design strategy information being satisfied to obtain the TFT pattern.

(2) drawing a storage capacitor pattern in a source/drain electrode metal layer in each of pixel regions of the reference pattern based on the reference pattern and the TFT pattern.

An initial layout of the pixel can be performed based on the determined size of the storage capacitor and the determined dimensions of the TFT based on the initial design. In a precondition of basic parameters being satisfied, and the TFT being fitted to design criteria, the initial layout of the pixel can be drawn. The methods of the layout, which is different from different designers, and from different companies. For example, same storage capacitors can be in a layout of a U-shape encircling the pixel, a line shape, H-shape, etc., and TFT can be different shapes with same channel widths as illustrated in the drawings. No matter how it is changed, the key parameters must be satisfied, and the shape of the TFT or the storage capacitor can also be adjusted usually for optical characteristics or process yield.

Furthermore, drawing a storage capacitor pattern in a source/drain electrode metal layer in each of pixel regions of the reference pattern based on the reference pattern and the TFT pattern includes when drawing the storage capacitor pattern in the source/drain electrode metal layer in each of the pixel regions of the reference pattern, referring to short edges of the pixels of each of the pixel regions to determine a top outer edge of the storage capacitor pattern; referring to the TFT pattern to determine a left outer edge of the storage capacitor pattern; referring to the pixel data line pattern to determine a right outer edge of the storage capacitor pattern; and drawing the storage capacitor pattern based on the top outer edge, the left outer edge, and the right outer edge.

Figure 7:
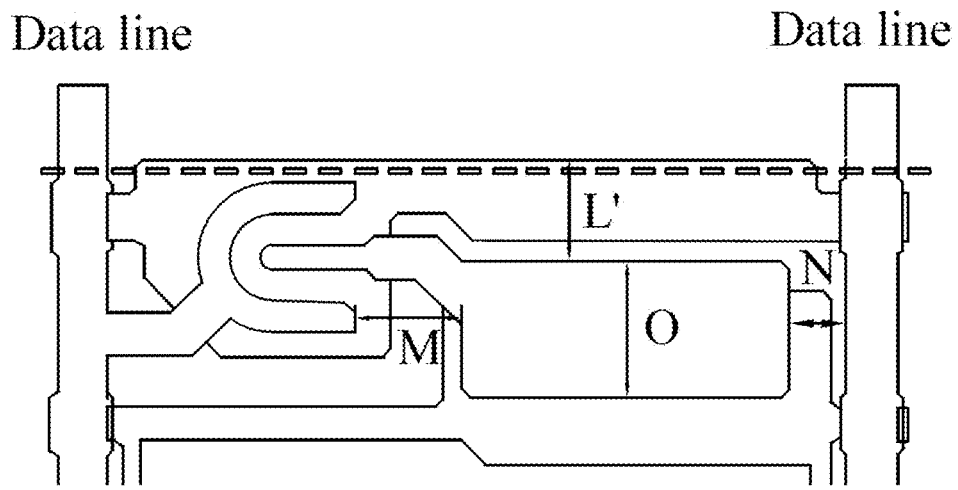
FIG. 7 is a structural schematic diagram of a storage capacitor pattern in a source/drain electrode metal layer of an embodiment of the present disclosure.
Figure 8:
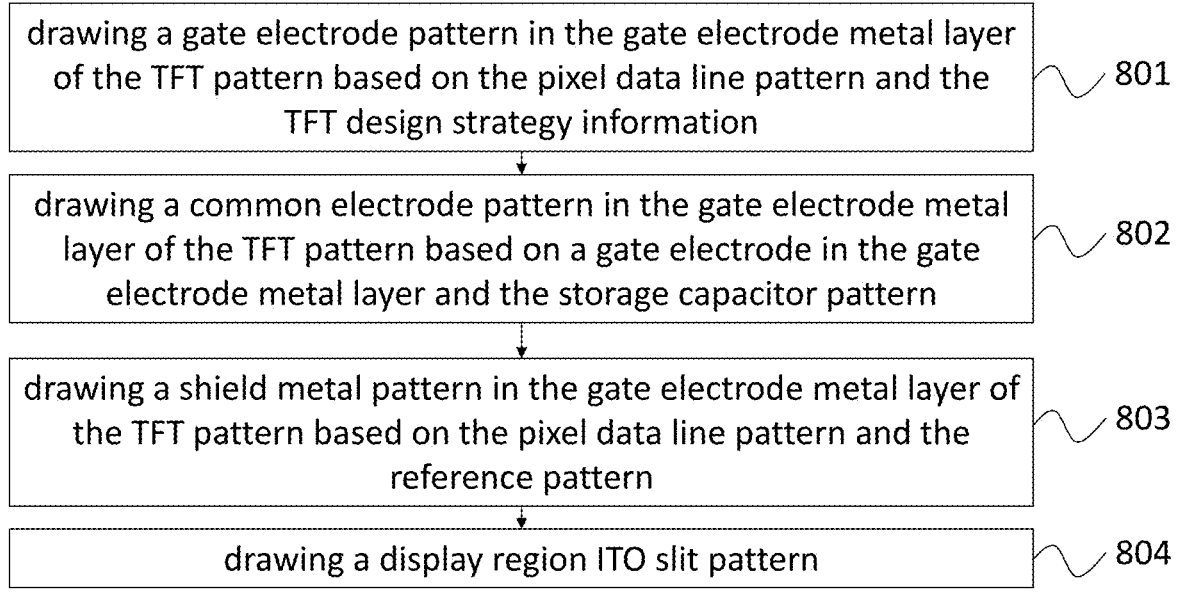
FIG. 8 is a flowchart of an embodiment of drawing related design patterns of the TFT patterns of the embodiment of the present disclosure.

In a specific embodiment, when the storage capacitor M2_Cst of the source/drain electrode metal layer is drawn, the TFT pattern and the pixel region are referred, and specifically is indicated in FIG. 7:

the top outer edge of the storage capacitor M2_Cst: referring to a distance L from a short edge of the pixel region;

the left outer edge of the storage capacitor M2_Cst: referring to a distance M from the source/drain electrode of the TFT pattern; and the right outer edge of the storage capacitor M2_Cst: referring to a distance N from the pixel data lines on the right side.

Wherein L, M, N can be configured in advance, which can be inputted by the user or configured automatically according to TFT with different lengths and widths.

(3) drawing the related design pattern of the TFT pattern based on the storage capacitor pattern and the pixel data line pattern.

Specifically, the step of drawing the related design pattern of the TFT pattern based on the storage capacitor pattern and the pixel data line pattern can further include steps 801 to 804, the specific are as follows:

- 801: drawing a gate electrode pattern in the gate electrode metal layer of the TFT pattern based on the pixel data line pattern and the TFT design strategy information.

Furthermore, the step of drawing the gate electrode pattern in the gate electrode metal layer of the TFT pattern based on the pixel data line pattern and the TFT design strategy information includes: determining two ends of the gate electrode of the gate electrode metal layer according to the pixel data line pattern; determining a numerical value of a middle section of the gate electrode in the gate electrode metal layer based on the TFT design strategy information; and drawing the gate electrode pattern in the gate electrode metal layer of the TFT pattern based on the two ends of the gate electrode in the gate electrode metal layer and the numerical value of the middle section of the gate electrode in the gate electrode metal layer.

Figure 9:
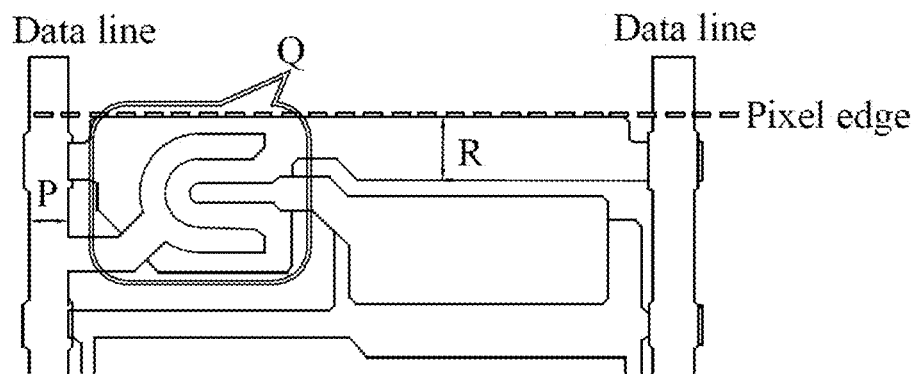
FIG. 9 is a structural schematic diagram of a gate electrode pattern in a gate electrode metal layer of an embodiment of the present disclosure.

Specifically, as illustrated in FIG. 9, in the gate electrode pattern M1-Gate of the gate electrode metal layer:

- the two ends: aligning and referring to padding value positions of the pixel data lines, and the thickness is same as the thickness P of the pixel data lines; and
- the numerical value of the middle section: drawn by referring to Q and R in the TFT pattern in FIG. 9.

Wherein, P, Q, and R are dimensional parameters configured in advance.

- 802: drawing a common electrode pattern in the gate electrode metal layer of the TFT pattern based on a gate electrode in the gate electrode metal layer and the storage capacitor pattern.

Furthermore, the step of drawing the common electrode pattern in the gate electrode metal layer of the TFT pattern based on the gate electrode pattern and the storage capacitor pattern of the gate electrode metal layer includes: determining a protruding position of a common electrode in the gate electrode metal layer based on the storage capacitor pattern; determining a horizontal position of the common electrode in the gate electrode metal layer based on the gate electrode pattern in the gate electrode metal layer; and drawing the common electrode pattern in the gate electrode metal layer of the TFT pattern based on the protruding position and the horizontal position of the gate electrode metal layer.

Figure 10:
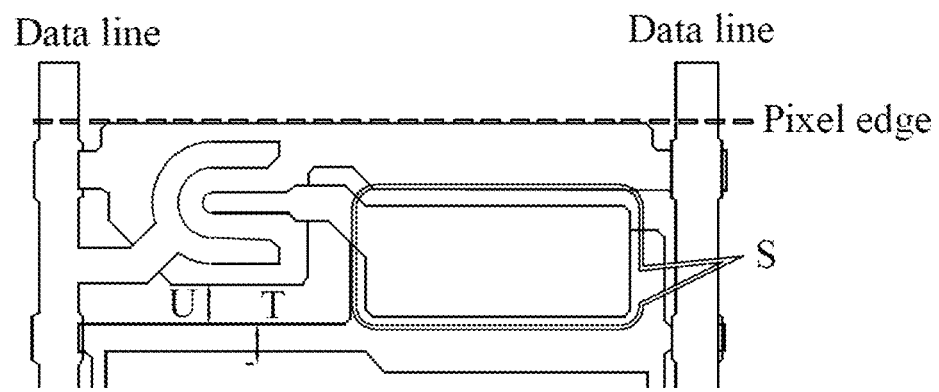
FIG. 10 is a structural schematic diagram of a common electrode pattern in the gate electrode metal layer of an embodiment of the present disclosure.

Specifically, as illustrated in FIG. 10, in a common electrode pattern M1-Acom of the gate electrode metal layer:

- the protruding position (S): drawn by referring to the storage capacitor pattern; and
- the horizontal position (T): drawn by referring to a gate electrode pattern M1_Gate of the gate electrode metal layer.

Wherein T is a dimensional parameter configured in advance.

- 803: drawing a shield metal pattern in the gate electrode metal layer of the TFT pattern based on the pixel data line pattern and the reference pattern.

Furthermore, the step of the pixel design strategy information comprises a design line width of the shielding metal in a vertical direction, a design line width of the shielding metal in a horizontal direction, and a design line width of the middle shielding metal, and drawing the shielding metal pattern in the gate electrode metal layer of the TFT pattern based on the pixel data line pattern and the reference pattern includes: obtaining the design line width of the shielding metal in the vertical direction, the design line width of the shielding metal in the horizontal direction, and the design line width of the middle shielding metal; and drawing the shielding metal pattern in the gate electrode metal layer of the TFT pattern according to the design line width of the shielding metal in the vertical direction, the design line width of the shielding metal in the horizontal direction, and the design line width of the middle shielding metal, and referring to the pixel data line pattern and the reference pattern.

Figure 11:
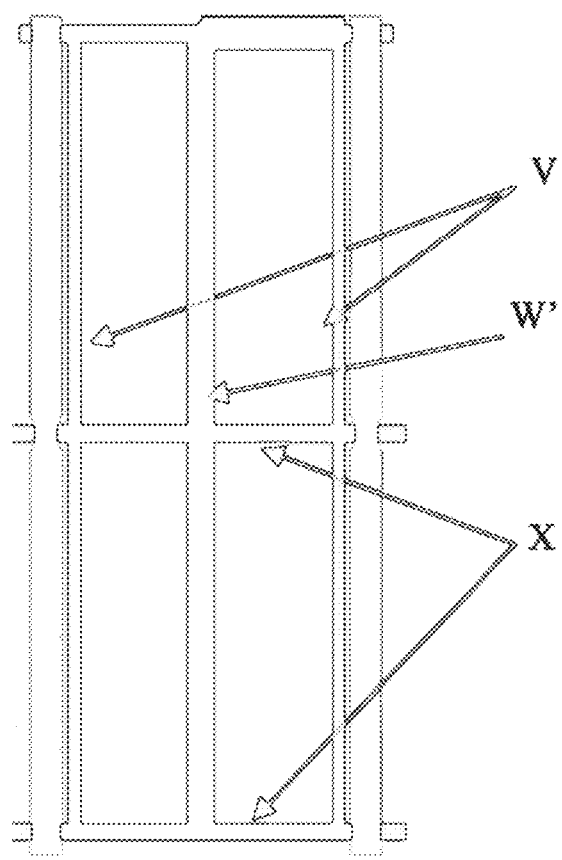
FIG. 11 is a structural schematic diagram of a shielding metal pattern of an embodiment of the present disclosure.

As illustrated in FIG. 11, a shielding metal pattern M1-SM is drawn by referring to the data line pattern and the reference pattern. A line width of a marked position can be selected automatically whether to draw, and the width can be adjusted automatically. In FIG. 11, V is a line width of a shielding metal (SM) design line in the vertical direction, X is a line width of the SM design line in the horizontal direction, and W' is a line width of the SM design line of the middle section.

- 804: drawing a display region ITO slit pattern.

The step of the pixel design strategy information includes slit angles and a number of a plurality of pixel partitions, and drawing the display region ITO slit pattern includes: obtaining the slit angles and the number of the plurality of pixel partitions in the pixel design strategy information; and drawing the display region ITO slit pattern according to the slit angles and the number of the plurality of pixel partitions.

In this embodiment, the drawing based on the ITO slit of the display region (selections of slit angles and a number of domains being included) includes a horizontal/vertical ITO trunk, whether a slit sealer design is used, etc.

In current pixel designs, there are two mainstream types. One is a 4-domain type, and another is an 8-domain type. The two pixel structures each have their own respective strengths and weaknesses. Wherein while the 4-domain pixel design has a relatively higher aperture ratio, its viewing angle characteristic is much worse relatively than the 8-domain type pixel design. However, the 8-domain-type pixel design have a better viewing angle characteristic relatively.

In an embodiment of the present disclosure, different ITO slit pattern of the display region can be set according to slit angles and the number of the pixel partitions in advance. After the slit angles and the number of the pixel partitions are determined, the ITO slit pattern of the display region can be drawn automatically according to the slit angles and the number of the pixel partitions.

After contents of the pixels of the array substrate are completed, all the patterns are transferred to a glass substrate finally. Therefore, a dimension of the glass substrate should be determined. In addition to being able to put down the array pixels and the wiring out of the array, some alignment marks are needed in the pixel design process of the embodiments of the present disclosure. These marks are generally placed at edges or corners of the glass, so if the dimension of the display region is 13 inches, considering the wiring out of the array and the alignment marks, the dimension of the glass substrate should be larger than 13 inches.

The above examples describe specific embodiments of drawing an array substrate related structural pattern in the single pixel based on the first design strategy information of the present disclosure. In embodiments of the present disclosure, a step of drawing a color film substrate related structural pattern in the single pixel based on the second design strategy information is further included. Specifically, the step of drawing a color film substrate related structural pattern in the single pixel based on the second design strategy information can include:

(1) drawing the color film substrate, wherein when the color film substrate is drawn, four outer edges of the color film substrate are aligned to the pixel regions corresponding to each of the pixels of the array substrate.

When the color film substrate is drawn, a color film substrate strategy information can be set in advance to directly generate corresponding color film substrate patterns. The basic one that should be ensured is that when the color film substrate is drawn, the four outer edges of the color film substrate are aligned to the pixel regions corresponding to each of the pixels of the array substrate.

(2) drawing an RGB color layer, wherein when the RGB color layer is drawn, four outer edges of the RGB color layer respectively shrink towards the inside corresponding to edges of the pixel region with preset values.

As same, when the RGB color layer is drawn, an RGB color layer strategy information can be set in advance to directly generate corresponding RGB color layer patterns. The basic one that should be ensured is that when the RGB color layer is drawn, the four outer edges of the RGB color layer shrink toward inside corresponding to edges of the pixel region with preset values, that is, the preset values of shrinking the four outer edges toward the inside can be adjustable according to actual using scenes, and at this time, color resist openings can be referred to distances from edges of the pixels to edges of the color resists.

(3) drawing a photo spacer (PS), wherein when drawing the PS, a dimension of the PS can refer to a preset PS dimension, distribution can refer to an relative distance between an opening of the color resist (CF open) and a black matrix (BM).

An actual dimension and the distribution of the PS are determined according to products, and they are generally referred to setting of an actual dimension and a distribution of PS of products of display panels with similar dimensions. The PS can be divided into a main PS and a Sub PS, and which one is used specifically can be determined according to actual using scenes. After selections are hinted to the user, the type of the PS can be obtained to draw the PS of corresponding types.

The pixel design strategy information can include the first design strategy information of the pixel related structure in the array substrate and the second design strategy information of the pixel related structure in the color film substrate is described in the embodiments mentioned above. It can be understood that the pixel design strategy information can further include a design strategy information of other additional structures, such as a black matrix, etc. can be drawn automatically by referring a preset black matrix strategy information.

After the pixel design diagram of designing the single pixel is drawn completely, active areas (AAs) of the display panel can be formed in an array manner. Afterwards, a cell gap and parameters on the materials and thickness of each layer of the array substrate can be inputted, which is illustrated as FIG. 12 specifically, wherein the cell gap is a thickness of a liquid crystal cell, and Tr % is the transmittance rate.

In some embodiments of the present disclosure, after drawing the pixel design diagram of the single pixel in the display panel, the method can further include steps of automated checking. Specifically, the pixel design method further includes: checking the whole pixel design diagram to determine whether the pixel design diagram satisfies the pixel design strategy information; and adjusting a drawn object of the pixel design diagram not satisfying the pixel design strategy information based on a design strategy information corresponding to the drawn object in the pixel design strategy information until satisfying the design strategy information corresponding to the drawn object.

While the entire pixel design diagram is being checked, if one of the pixel design parameters is abnormal, a hint can be prompted in the pixel design program. The manner of the hint is that an error can be outputted directed at the specific pixel design parameters being abnormal during the pixel design procedure.

In some other embodiments, after the pixel design diagram of the single pixel of the display panel is drawn, a simulation program with integrated circuit emphasis (SPICE) model is invoked to output different error charging voltages, charging rate data of charging time, and a feedthrough voltage. After manually judging whether the model meets the requirements, the new adjusted pixel design parameters are manually re-entered, the pixel design strategy information is updated, and the new pixel design is redrawn. Specifically, the pixel design method can further include: performing the charging test on the pixel design diagram and outputting different error charging voltages, charging rate data of charging time, and the feedthrough voltage; if the charging rate being too low, a charging evenness being poor, or if the feedthrough voltage being excessively large being is displayed in the charging rate data, new pixel design parameters inputted by the user can be obtained by adjusting the pixel design strategy information to obtain a new pixel design strategy information based on the new pixel design parameters, and drawing a new pixel design diagram of the display panel based on the new pixel design strategy information.

Furthermore, the new pixel design parameter can be related design parameters corresponding to problems. If the charging rate being too low or the charging evenness being poor is displayed in the charging rate data, then the new pixel design parameters are the related design parameter corresponding to the charging rate or the charging evenness. If the feedthrough voltage is excessively large, then the new pixel design parameter is the related design corresponding to the feedthrough voltage.

In this embodiment, drawing the new pixel design diagram of the display panel on the basis of the new pixel design strategy information can refer to the specific process of drawing the pixel design diagram of the display panel on the basis of pixel design strategy information mentioned above in the embodiments, and redundant description will not be mentioned herein.

Because the charging rate being too low, charging evenness being poor, or the feedthrough voltage being excessively large can be displayed in the charging rate data of this embodiment, the user is hinted. Moreover, the new pixel design parameters obtained are targeted inputted by the user. The pixel design strategy information is adjusted based on the new pixel design parameters aimed at specific problems, the adjusted pixel design parameters can draw the new pixel design diagram of the display panel faster. Therefore, with no need to re-draw and adjust, research and development efficiency is improved.

Because the display panel technology is improved continuously and the design specifications of the display panel are constantly updated also, the pixel design strategy information of the display panel can be updated synchronously if the pixel design specifications are updated due to process improvement and design optimization. Specifically, in some embodiments of the present disclosure, the pixel design method can further include: obtaining a updated pixel design strategy information for the display panel, wherein the updated pixel design strategy information includes at least one structural pixel design strategy information, or corresponding relations between at least two pixel structures; and updating the pixel design strategy information of the display panel based on the updated pixel design strategy information. Afterwards, the new pixel design can be drawn based on the pixel design strategy information of the updated display panel.

Figure 13:
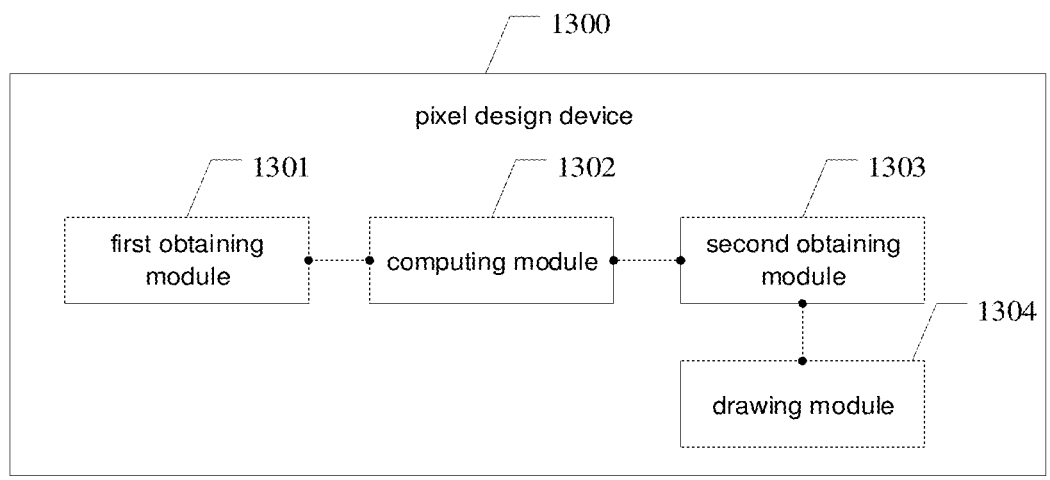
FIG. 13 is a flowchart of an embodiment of a pixel design device provided by the embodiment of the present disclosure.

In order to better implement the pixel design method of the embodiments of the present disclosure, an embodiment of the present disclosure further provides a pixel design device based on the pixel design method as illustrated in FIG. 13. A pixel design device 1300 includes:
- a first obtaining module 1301 used for obtaining design dimension and resolution information of a display panel configured by a user;
- a computing module 1302 used for computing dimensions of a single pixel of the display panel based on the design dimension and resolution information of the display panel;
- a second obtaining module 1303 used for obtaining a preset pixel design strategy information, wherein the pixel design strategy information includes design transmittance rate information of the display panel; and
- a drawing module 1304 used for drawing a pixel design diagram of the single pixel in the display panel based on the dimensions of the single pixel and the pixel design strategy information.

During pixel design processes performed by the user, in the embodiment of the present disclosure, on the basis of the design dimension information of the display panel, intelligently drawing diagrams can be performed on pixel designs, dependency on design experiences from designers can be lowered, and the designers calculating design parameters manually does not need. Therefore, duration and assessment time of product designs are reduced, pixel designs of products that satisfies requirements are produced rapidly, research and development efficiency is improved, and human resources and cost are saved.

In some embodiments of the present disclosure, the design dimension information of the display panel includes a diagonal length of an effective display region in the display panel. The computing module is specifically used for:
- obtaining an aspect ratio of the display panel;
- according to the Pythagorean theorem by computing a length and a width of the effective display region in the display panel according to the aspect ratio of the display panel and the diagonal length of an effective display region in the display panel; and
- computing the dimensions of the single pixel in the display panel respectively according to the length and the width of the effective display region in the display panel and the design resolution information of the display panel.

In some embodiments of the present disclosure, the display panel is a liquid crystal display panel, the pixel design strategy information includes a first design strategy information of a pixel related structure in an array substrate, and a second design strategy information of a pixel related structure in a color film substrate.

The drawing module is specifically used for:
- drawing a reference pattern of the single pixel based on the dimensions of the single pixel;
- drawing an array substrate related structural pattern in the single pixel based on the first design strategy information; and
- drawing a color film substrate related structural pattern in the single pixel based on the second design strategy information.

In some embodiments of the present disclosure, the first design strategy information includes a thin film transistor (TFT) design strategy information of the display panel, and the array substrate related structural pattern includes a related design pattern of a TFT design pattern, The drawing module is specifically used for:
- obtaining a line width of a plurality of pixel data lines and an interval between pixels configured by the user, and generating a pixel data line pattern in the reference pattern;
- obtaining parameters of a length and a width of TFT in the pixels configured by the user; and
- drawing the related design pattern of the TFT design pattern based on the parameters of the length and the width of the TFT and the TFT design strategy information.

In some embodiments of the present disclosure, the drawing module is specifically used for:
- drawing the TFT pattern in each of the pixels of the display panel based on the parameters of the length and the width of the TFT and the TFT design strategy information;
- drawing a storage capacitor pattern in a source/drain electrode metal layer in each of the pixel regions of the reference pattern based on the reference pattern and the TFT pattern; and
- drawing the related design pattern of the TFT pattern based on the storage capacitor pattern and the pixel data line pattern.

In some embodiments of the present disclosure, the drawing module is specifically used for:
- drawing a gate electrode pattern in the gate electrode metal layer of the TFT pattern based on the pixel data line pattern and the TFT design strategy information;
- drawing a common electrode pattern in the gate electrode metal layer of the TFT pattern based on a gate electrode in the gate electrode metal layer and the storage capacitor pattern;
- drawing a shield metal pattern in the gate electrode metal layer of the TFT pattern based on the pixel data line pattern and the reference pattern; and
- drawing a display region indium tin oxide (ITO) slit pattern.

In some embodiments of the present disclosure, the drawing module is specifically used for:
- determining two ends of the gate electrode of the gate electrode metal layer according to the pixel data line pattern;
- determining a numerical value of a middle section of the gate electrode in the gate electrode metal layer based on the TFT design strategy information; and
- drawing the gate electrode pattern in the gate electrode metal layer of the TFT pattern based on the two ends of the gate electrode in the gate electrode metal layer and the numerical value of the middle section of the gate electrode in the gate electrode metal layer.

In some embodiments of the present disclosure, the drawing module is specifically used for:
- determining a protruding position of a common electrode in the gate electrode metal layer based on the storage capacitor pattern;

determining a horizontal position of the common electrode in the gate electrode metal layer based on the gate electrode pattern in the gate electrode metal layer; and drawing the common electrode pattern in the gate electrode metal layer of the TFT pattern based on the protruding position and the horizontal position of the gate electrode metal layer.

In some embodiments of the present disclosure, the pixel design strategy information includes a design line width of the shielding metal in a vertical direction, a design line width of the shielding metal in a horizontal direction. The drawing module is specifically used for:

obtaining the design line width of the shielding metal in the vertical direction, the design line width of the shielding metal in the horizontal direction, and the design line width of the middle shielding metal; and drawing the shielding metal pattern in the gate electrode metal layer of the TFT pattern according to the design line width of the shielding metal in the vertical direction, the design line width of the shielding metal in the horizontal direction, and the design line width of the middle shielding metal, and referring to the pixel data line pattern and the reference pattern.

In some embodiments of the present disclosure, the drawing module is specifically used for:

obtaining the slit angles and the number of the plurality of pixel partitions in the pixel design strategy information, and drawing the display region ITO slit pattern according to the slit angles and the number of the plurality of pixel partitions.

In some embodiments of the present disclosure, the drawing module is specifically used for:

generating an initial TFT pattern that satisfies the parameters of the length and the width of the TFT based on the parameters of the length and the width of the TFT;

checking process parameters of the TFT, design properties of each layer of the TFT, and design properties between each layer of the TFT in the initial TFT pattern based on the TFT design strategy information; and performing pattern adjustment on design properties of each layer of the TFT, and design properties between each layer of the TFT that do not satisfy design properties of the TFT design strategy information until the TFT design strategy information being satisfied to obtain the TFT pattern, wherein process parameters of the TFT include at least one of an electron mobility parameter, a cut-off current parameter, a leakage current parameter, a parasitic capacitance parameter, or a TFT fillet design parameter;

the design properties of each layer of the TFT comprise at least one of material and thickness parameters, line width parameters of each of the layers; and the design properties between each layer of the TFT include interval parameters between each of the layers of the TFT and alignment error limitation parameters between each layers of the TFT.

In some embodiments of the present disclosure, the drawing module is specifically used for when drawing the storage capacitor pattern in the source/drain electrode metal layer in each of the pixel regions of the reference pattern, referring to short edges of the pixels of each of the pixel regions to determine a top outer edge of the storage capacitor pattern;

referring to the TFT pattern to determine a left outer edge of the storage capacitor pattern; referring to the pixel data line pattern to determine a right outer edge of the storage capacitor pattern; and drawing the storage capacitor pattern based on the top outer edge, the left outer edge, and the right outer edge.

In some embodiments of the present disclosure, the device further includes a detection adjustment module. The detection adjustment module is used for:

after drawing the pixel design diagram of the single pixel in the display panel, checking the whole pixel design diagram to determine whether the pixel design diagram satisfies the pixel design strategy information; and adjusting a drawn object of the pixel design diagram not satisfying the pixel design strategy information based on a design strategy information corresponding to the drawn object in the pixel design strategy information until satisfying the design strategy information corresponding to the drawn object.

In some embodiments of the present disclosure, the device further includes a test adjustment module. The test adjustment module is used for:

after drawing the pixel design diagram of the single pixel in the display panel, performing a charging test on the pixel design diagram, outputting different error charging voltages, charging rate data of charging time, and a feedthrough voltage;

if the charging rate being too low, a charging evenness being poor, or the feedthrough voltage being excessively large being displayed in the charging rate data, new pixel design parameters inputted by the user can be obtained by adjusting the pixel design strategy information to obtain a new pixel design strategy information based on the new pixel design parameters; and drawing a new pixel design diagram of the display panel based on the new pixel design strategy information.

An embodiment of the present disclosure further provides an electronic equipment, which is integrated with any of the pixel design devices provided by the embodiments of the present disclosure. The electronic equipment includes:

one or a plurality of processors;

a storage device; and one or a plurality of application programs, wherein the one or the plurality of application programs is/are stored in the storage device and is/are executed by the processors to realize the steps of any embodiment of the pixel design method mentioned above.

Figure 14:
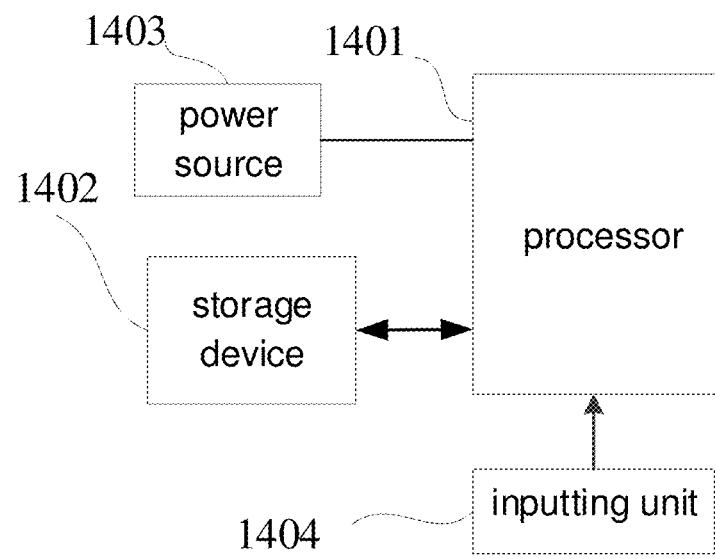
FIG. 14 is a flowchart of an embodiment of an electronic equipment provided by the embodiment of the present disclosure.

An embodiment of the present disclosure further provides the electronic equipment, which is integrated with any of the pixel design devices provided by embodiments of the present disclosure. Illustrated in FIG. 14 is a structural schematic diagram of the electronic equipment relating to an embodiment of the present disclosure, and specifically, the electronic equipment can include components such as one or more than one of processors 1401 of processing core, one or more than one of storage devices 1402 of computer readable storage media, a power source 1403, and an inputting unit 1404, etc. A person skilled in the art can understand that, the structure of the electronic equipment shown in FIG. 14 does not constitute a limitation on the control device for switching between media play devices, and may include components that are more or fewer than those shown in the figure, or a combination of some components, or different component arrangements.

Wherein, the processors 1401 are a control center of the electronic equipment, are connected to parts of the entire electronic equipment by using various interfaces and lines, and performs various functions and data processing of the electronic device by running or executing a software program and/or a module stored in the storage devices 1402 and invoking data stored in the storage unit, thereby monitoring the electronic equipment entirely. Optionally, the processor 1401 may include one or more processing cores. Preferably, the processor 1401 may be integrated with an application processor and a modulating-and-demodulating processor, wherein the application processor is mainly used to process operating system, user interface, applications, etc., and the modulating-and-demodulating processor is mainly used for processing wireless communications. It can be understood that the modulating-and-demodulating processor may also not be integrated into the processor 1401.

The storage device 1402 can store software programs and modules. The storage device 1402 runs the software programs and the modules stored in the storage device 1402 to perform various functional applications and process data. The storage device 1402 can include a program storage area and a data storage area, wherein the program storage area can store the operating system, at least one application required by functions (e.g. sound playback function, image playback function, etc.), etc. The data storage area can store such as the data, etc. generated by the use of the electronic equipment. In addition, the storage device 1402 can include high-speed random access memories (RAM), non-volatile memory (ROM), e.g. at least one disks storage device, flash memory devices, or other volatile solid state memory devices. Correspondingly, the storage device 1402 may also include a memory controller for providing access for the storage device 1402 from the processor 1401.

The electronic equipment further include a power supply 1403 supplying powers to various components. Preferably, the power supply 1403 can realize functions such as charging, discharging and power consumption management by logically connected to the processor 1401 through a power supply management system. The power supply 1403 can further include one or more arbitrary components such as a DC power supply or an AC power supply, a recharging system, a power supply failure detection circuit, a power supply converter or inverter, a power supply status indicator, etc.

The electronic equipment can further include an input unit 1404. The input unit 1404 can used for receiving entered information of numbers or characters, and for generating keyboard, mouse, joystick and optical or trackball signal input related to user settings and functions control.

Although not shown, the electronic equipment can further include display units, etc., and redundant description will not be mentioned herein again. Specifically, in this embodiment, the processor 1401 of the electronic equipment loads an executable file corresponding to one or more processes of application programs to storage device 1402, and the processor 1401 runs the application program stored in the storage device 1402 to realize various functions as follows:

obtaining design dimension and resolution information of a display panel configured by a user; computing dimensions of a single pixel of the display panel based on the design dimension and resolution information of the display panel; obtaining a preset pixel design strategy information, wherein the pixel design strategy information comprises design transmittance rate information of the display panel; and drawing a pixel design diagram of the single pixel in the display panel based on the dimensions of the single pixel and the pixel design strategy information.

It will be understood by those skilled in the art that all or a part of the steps of various method in the above embodiments may be completed by instructions or by controlling related hardware, in which the instructions may be stored in a computer readable medium and loaded and executed by the processor.

For this, an embodiment of the present disclosure provides a computer readable medium. The readable medium can include a read only memory (ROM), a random access memory (RAM), a magnetic disk, or a disc, etc. Computer programs are stored in the computer readable medium. The computer programs are loaded by the processor to execute the steps of any pixel design method provided by the embodiments of the present disclosure.

In the embodiments mentioned above, the descriptions to the various embodiments are emphasized, and the part is not described in detailed in an embodiment, can refer to the detailed description of other embodiments mentioned above, and will not give unnecessary details herein. During a specific implementation, the various units or structures mentioned above may be implemented as a separate entity, or may be implemented in any combination, as the same or several entities, and there is no specific limitation.

The pixel design method, the pixel design device, and the electronic equipment provided by the embodiments of the present disclosure are described in detail. This article uses specific cases for describing the principles and the embodiments of the present disclosure, and the description of the embodiments mentioned above is only for helping to understand the method and the core idea of the present disclosure. Meanwhile, for those skilled in the art, will have various changes in specific embodiments and application scopes according to the idea of the present disclosure. In summary, the content of the specification should not be understood as limit to the present disclosure.

What is claimed is:

1. A pixel design method, comprising:
   obtaining design dimension and resolution information of a display panel configured by a user;
   computing dimensions of a single pixel of the display panel based on the design dimension and resolution information of the display panel;
   obtaining a preset pixel design strategy information, wherein the pixel design strategy information comprises design transmittance rate information of the display panel; and
   drawing a pixel design diagram of the single pixel in the display panel based on the dimensions of the single pixel and the pixel design strategy information;
   wherein the design dimension information of the display panel comprises a diagonal length of an effective display region in the display panel, and computing the dimensions of the single pixel of the display panel based on the design dimension and resolution information of the display panel comprises:
   obtaining an aspect ratio of the display panel;
   computing a length and a width of the effective display region in the display panel according to the aspect ratio of the display panel and the diagonal length of an effective display region in the display panel, according to Pythagorean theorem; and
   computing the dimensions of the single pixel in the display panel according to the length and the width of the effective display region in the display panel and the design resolution information of the display panel.

2. The pixel design method as claimed in claim 1, wherein the display panel is a liquid crystal display panel, the pixel design strategy information comprises a first design strategy information of a pixel-related structure in an array substrate, and a second design strategy information of a pixel-related structure in a color film substrate; and drawing the pixel design diagram of the single pixel in the display panel based on the dimensions of the single pixel and the pixel design strategy information comprises:

drawing a reference pattern of the single pixel based on the dimensions of the single pixel;

drawing an array substrate related structural pattern in the single pixel based on the first design strategy information; and drawing a color film substrate related structural pattern in the single pixel based on the second design strategy information.

3. The pixel design method as claimed in claim 2, wherein the first design strategy information comprises a thin film transistor (TFT) design strategy information of the display panel, the array substrate related structural pattern comprises a related design pattern of a TFT design pattern, and drawing the array substrate related structural pattern in the single pixel based on the first design strategy information comprises:

obtaining a line width of a plurality of pixel data lines and an interval between pixels configured by the user, and generating a pixel data line pattern in the reference pattern;

obtaining parameters of a length and a width of a TFT in the display panel configured by the user; and drawing the related design pattern of the TFT design pattern based on the parameters of the length and the width of the TFT and the TFT design strategy information.

4. The pixel design method as claimed in claim 3, wherein drawing the related design pattern of the TFT pattern based on the parameters of the length and the width of the TFT and the TFT design strategy information comprises:

drawing the TFT pattern in each pixel of the display panel based on the parameters of the length and the width of the TFT and the TFT design strategy information;

drawing a storage capacitor pattern in a source/drain electrode metal layer in each pixel region of the reference pattern based on the reference pattern and the TFT pattern; and drawing the related design pattern of the TFT pattern based on the storage capacitor pattern and the pixel data line pattern.

5. The pixel design method as claimed in claim 4, wherein drawing the related design pattern of the TFT pattern based on the storage capacitor pattern and the pixel data line pattern comprises:

drawing a gate electrode pattern in a gate electrode metal layer of the TFT pattern based on the pixel data line pattern and the TFT design strategy information;

drawing a common electrode pattern in the gate electrode metal layer of the TFT pattern based on a gate electrode pattern in the gate electrode metal layer and the storage capacitor pattern;

drawing a shield metal pattern in the gate electrode metal layer of the TFT pattern based on the pixel data line pattern and the reference pattern; and drawing a display region indium tin oxide (ITO) slit pattern.

6. The pixel design method as claimed in claim 5, wherein drawing the gate electrode pattern in the gate electrode metal layer of the TFT pattern based on the pixel data line pattern and the TFT design strategy information comprises:

determining two ends of the gate electrode of the gate electrode metal layer according to the pixel data line pattern;

determining a numerical value of a middle section of the gate electrode in the gate electrode metal layer based on the TFT design strategy information; and drawing the gate electrode pattern in the gate electrode metal layer of the TFT pattern based on the two ends of the gate electrode in the gate electrode metal layer and the numerical value of the middle section of the gate electrode in the gate electrode metal layer.

7. The pixel design method as claimed in claim 5, wherein drawing the common electrode pattern in the gate electrode metal layer of the TFT pattern based on the gate electrode pattern and the storage capacitor pattern of the gate electrode metal layer comprises:

determining a protruding position of a common electrode in the gate electrode metal layer based on the storage capacitor pattern;

determining a horizontal position of the common electrode in the gate electrode metal layer based on the gate electrode pattern in the gate electrode metal layer; and drawing the common electrode pattern in the gate electrode metal layer of the TFT pattern based on the protruding position and the horizontal position of the gate electrode metal layer.

8. The pixel design method as claimed in claim 5, wherein the pixel design strategy information comprises a design line width of the shielding metal in a vertical direction, a design line width of the shielding metal in a horizontal direction, and a design line width of the middle shielding metal, and drawing the shielding metal pattern in the gate electrode metal layer of the TFT pattern based on the pixel data line pattern and the reference pattern comprises:

obtaining the design line width of the shielding metal in the vertical direction, the design line width of the shielding metal in the horizontal direction, and the design line width of the middle shielding metal; and drawing the shielding metal pattern in the gate electrode metal layer of the TFT pattern according to the design line width of the shielding metal in the vertical direction, the design line width of the shielding metal in the horizontal direction, and the design line width of the middle shielding metal, and referring to the pixel data line pattern and the reference pattern.

9. The pixel design method as claimed in claim 5, wherein the pixel design strategy information comprises a slit angle and a number of pixel partitions, and the step of drawing a display region ITO slit pattern comprises:

obtaining the slit angle and the number of pixel partitions in the pixel design strategy information; and drawing the display region ITO slit pattern according to the slit angle and the number of the plurality of pixel partitions.

10. The pixel design method as claimed in claim 4, wherein drawing the TFT pattern in each of the pixels of the display panel based on the parameters of the length and the width of the TFT and the TFT design strategy information comprises:

generating an initial TFT pattern that satisfies the parameters of the length and the width of the TFT based on the parameters of the length and the width of the TFT;

checking process parameters of the TFT, design properties of each layer of the TFT, and design properties between each layer of the TFT in the initial TFT pattern based on the TFT design strategy information; and performing pattern adjustment on design properties of each layer of the TFT, and design properties between each layer of the TFT that do not satisfy design properties of the TFT design strategy information until the TFT design strategy information being satisfied to obtain the TFT pattern, wherein the process parameters of the TFT comprise at least one of an electron mobility parameter, a cut-off current parameter, a leakage current parameter, a parasitic capacitance parameter, or a TFT fillet design parameter; the design properties of each layer of the TFT comprise at least one of material and thickness parameters, or line width parameters of each of the layers; and the design properties between each layer of the TFT comprise interval parameters between each layer of the TFT and alignment error limitation parameters between each layer of the TFT.

11. The pixel design method as claimed in claim 4, wherein drawing the storage capacitor pattern in the source/drain electrode metal layer in each of the pixel regions of the reference pattern based on the reference pattern and the TFT pattern comprises:

when drawing the storage capacitor pattern in the source/drain electrode metal layer in each of the pixel regions of the reference pattern, referring to short edges of the pixels of each of the pixel regions to determine a top outer edge of the storage capacitor pattern;

referring to the TFT pattern to determine a left outer edge of the storage capacitor pattern;

referring to the pixel data line pattern to determine a right outer edge of the storage capacitor pattern; and drawing the storage capacitor pattern based on the top outer edge, the left outer edge, and the right outer edge.

12. The pixel design method as claimed in claim 1, wherein after drawing the pixel design diagram of the single pixel in the display panel, the method comprises:

checking the whole pixel design diagram to determine whether the pixel design diagram satisfies the pixel design strategy information; and adjusting a drawn object of the pixel design diagram not satisfying the pixel design strategy information based on a design strategy information corresponding to the drawn object in the pixel design strategy information until satisfying the design strategy information corresponding to the drawn object.

13. The pixel design method as claimed in claim 1, wherein after drawing the pixel design diagram of the single pixel in the display panel, the method comprises:

performing a charging test on the pixel design diagram, outputting different error charging voltages, a charging rate data of a charging time, and a feedthrough voltage;

if the charging rate is too low, a charging evenness is poor, or the feedthrough voltage being excessively large is displayed in the charging rate data, obtaining new pixel design parameters inputted by the user;

adjusting the pixel design strategy information to obtain a new pixel design strategy information based on the new pixel design parameters; and drawing a new pixel design diagram of the display panel based on the new pixel design strategy information.

14. A pixel design device, comprising:

a first obtaining module used for obtaining design dimension and resolution information of a display panel configured by a user;

a computing module used for computing dimensions of a single pixel of the display panel based on the design dimension and resolution information of the display panel;

a second obtaining module used for obtaining a preset pixel design strategy information, wherein the pixel design strategy information comprises design transmittance rate information of the display panel; and a drawing module used for drawing a pixel design diagram of the single pixel in the display panel based on the dimensions of the single pixel and the pixel design strategy information;

wherein the design dimension information of the display panel comprises a diagonal length of an effective display region in the display panel, and computing the dimensions of the single pixel of the display panel based on the design dimension information of the display panel, and the computing module is specifically used for:

obtaining an aspect ratio of the display panel;

computing a length and a width of the effective display region in the display panel according to the aspect ratio of the display panel and the diagonal length of an effective display region in the display panel, according to Pythagorean theorem; and computing the dimensions of the single pixel in the display panel according to the length and the width of the effective display region in the display panel and the design resolution information of the display panel.

15. The pixel design device as claimed in claim 14, wherein the display panel is a liquid crystal display panel, the pixel design strategy information comprises a first design strategy information of a pixel related structure in an array substrate, and a second design strategy information of a pixel related structure in a color film substrate;

the drawing module is specifically used for:

drawing a reference pattern of the single pixel based on the dimensions of the single pixel;

drawing an array substrate related structural pattern in the single pixel based on the first design strategy information; and drawing a color film substrate related structural pattern in the single pixel based on the second design strategy information.

16. The pixel design device as claimed in claim 15, wherein the first design strategy information comprises a thin film transistor (TFT) design strategy information of the display panel, the array substrate related structural pattern comprises a related design pattern of a TFT design pattern, and the drawing module is specifically used for:

obtaining a line width of a plurality of pixel data lines and an interval between pixels configured by the user, and generating a pixel data line pattern in the reference pattern;

obtaining parameters of a length and a width of TFT in the display panel configured by the user; and drawing the related design pattern of the TFT design pattern based on the parameters of the length and the width of the TFT and the TFT design strategy information.

17. The pixel design device as claimed in claim 16, wherein the drawing module is specifically used for:

drawing the TFT pattern in each of the pixels of the display panel based on the parameters of the length and the width of the TFT and the TFT design strategy information;

drawing a storage capacitor pattern in a source/drain electrode metal layer in each of pixel regions of the reference pattern based on the reference pattern and the TFT pattern; and drawing the related design pattern of the TFT pattern based on the storage capacitor pattern and the pixel data line pattern.

18. A pixel design method, comprising:

obtaining design dimension and resolution information of a display panel configured by a user;

computing dimensions of a single pixel of the display panel based on the design dimension and resolution information of the display panel;

obtaining a preset pixel design strategy information, wherein the pixel design strategy information comprises design transmittance rate information of the display panel; and drawing a pixel design diagram of the single pixel in the display panel based on the dimensions of the single pixel and the pixel design strategy information; wherein the display panel is a liquid crystal display panel, the pixel design strategy information comprises a first design strategy information of a pixel-related structure in an array substrate, and a second design strategy information of a pixel-related structure in a color film substrate; and drawing the pixel design diagram of the single pixel in the display panel based on the dimensions of the single pixel and the pixel design strategy information comprises:

drawing a reference pattern of the single pixel based on the dimensions of the single pixel;

drawing an array substrate related structural pattern in the single pixel based on the first design strategy information; and drawing a color film substrate related structural pattern in the single pixel based on the second design strategy information.

19. The pixel design method as claimed in claim 18, wherein the first design strategy information comprises a thin film transistor (TFT) design strategy information of the display panel, the array substrate related structural pattern comprises a related design pattern of a TFT design pattern, and drawing the array substrate related structural pattern in the single pixel based on the first design strategy information comprises:

obtaining a line width of a plurality of pixel data lines and an interval between pixels configured by the user, and generating a pixel data line pattern in the reference pattern;

obtaining parameters of a length and a width of a TFT in the display panel configured by the user; and drawing the related design pattern of the TFT design pattern based on the parameters of the length and the width of the TFT and the TFT design strategy information.

20. The pixel design method as claimed in claim 19, wherein drawing the related design pattern of the TFT pattern based on the parameters of the length and the width of the TFT and the TFT design strategy information comprises:

drawing the TFT pattern in each pixel of the display panel based on the parameters of the length and the width of the TFT and the TFT design strategy information;

drawing a storage capacitor pattern in a source/drain electrode metal layer in each pixel region of the reference pattern based on the reference pattern and the TFT pattern; and drawing the related design pattern of the TFT pattern based on the storage capacitor pattern and the pixel data line pattern.

* * * * *